US010852119B2

(12) United States Patent
Harsila et al.

(10) Patent No.: US 10,852,119 B2
(45) Date of Patent: Dec. 1, 2020

(54) COORDINATE MEASUREMENT PROBE BODY

(71) Applicant: Mitutoyo Corporation, Kawasaki (JP)

(72) Inventors: Scott Allen Harsila, Bothell, WA (US); Richard Alan Wissner, Redmond, WA (US); Bjorn Erik Bertil Jansson, Snohomish, WA (US); Satoshi Koga, Kawasaki (JP); Akinori Saito, Kawasaki (JP)

(73) Assignee: Mitutoyo Corporation, Kawasaki (JP)

( * ) Notice: Subject to any disclaimer, the term of this patent is extended or adjusted under 35 U.S.C. 154(b) by 188 days.

(21) Appl. No.: 16/094,836

(22) PCT Filed: Apr. 18, 2017

(86) PCT No.: PCT/IB2017/000533
§ 371 (c)(1),
(2) Date: Oct. 18, 2018

(87) PCT Pub. No.: WO2017/182875
PCT Pub. Date: Oct. 26, 2017

(65) Prior Publication Data
US 2019/0120606 A1    Apr. 25, 2019

Related U.S. Application Data

(60) Provisional application No. 62/325,763, filed on Apr. 21, 2016.

(51) Int. Cl.
*G01B 7/012* (2006.01)
*G01B 5/012* (2006.01)
(Continued)

(52) U.S. Cl.
CPC ............. *G01B 7/012* (2013.01); *G01B 5/012* (2013.01); *G01B 7/001* (2013.01); *G01R 1/067* (2013.01)

(58) Field of Classification Search
CPC ........ G01B 7/012; G01B 7/016; G01B 5/012; G01B 5/016
(Continued)

(56) References Cited

U.S. PATENT DOCUMENTS 4,451,988 A * 6/1984 McMurtry ............. G01B 7/012
33/561
4,553,001 A * 11/1985 Kroetsch ................ B82Y 15/00
200/61.41
(Continued)

FOREIGN PATENT DOCUMENTS

| CN | 1699909 A | 11/2005 |
|---|---|---|
| CN | 103234440 A | 7/2013 |
| EP | 1 953 497 A1 | 8/2008 |

OTHER PUBLICATIONS

International Search Report and Written Opinion dated Jul. 24, 2017, issued in corresponding International Application No. PCT/IB2017/000533, filed Apr. 18, 2017, 9 pages.
(Continued)

*Primary Examiner* — Christopher W Fulton
(74) *Attorney, Agent, or Firm* — Christensen O'Connor Johnson Kindness, PLLC

(57) ABSTRACT

A coordinate measuring probe body includes a rigid probe body structure including an upper mounting portion, a compliant element mounting frame, and an axial extension portion between them. A stylus suspension portion includes compliant elements that suspend a moving element from the compliant element mounting frame. A displacement sensing arrangement that senses displacement of the moving element includes displacement sensors that output a respective displacement signals. A circuit board assembly that receives the displacement signals has three component mounting portions which are interconnected with a flexible circuit component, and located around the axial extension portion. In
(Continued)

various embodiments, all of the compliant elements are located on a distal side of the circuit board assembly.

20 Claims, 7 Drawing Sheets

(51) Int. Cl.
    *G01B 7/00*     (2006.01)
    *G01R 1/067*     (2006.01)

(58) Field of Classification Search
    USPC .................................................. 33/561, 558
    See application file for complete search history.

(56) References Cited

U.S. PATENT DOCUMENTS

| | | | | |
|---|---|---|---|---|
| 5,209,131 A * | 5/1993 | Baxter | ............... | G01B 3/008 33/559 |
| 5,247,751 A * | 9/1993 | Ohya | ............... | G01B 7/012 33/558 |
| 5,526,576 A * | 6/1996 | Fuchs | ............... | G01B 7/012 33/503 |
| 5,755,038 A * | 5/1998 | McMurtry | ............ | G01B 5/012 33/556 |
| 9,471,054 B2 * | 10/2016 | McMurtry | ............ | G05B 19/182 |
| 10,145,666 B2 * | 12/2018 | Jansson | ............... | G01B 5/016 |
| 2002/0158136 A1 | 10/2002 | Daniel et al. | | |
| 2009/0043534 A1 * | 2/2009 | Prestidge | ............... | G01B 7/012 702/152 |
| 2009/0140873 A1 | 6/2009 | Collingwood et al. | | |
| 2016/0169656 A1 * | 6/2016 | Padovani | ............... | G01B 5/012 33/503 |
| 2016/0258733 A1 * | 9/2016 | Shimaoka | ............... | G01B 5/20 |
| 2017/0248402 A1 * | 8/2017 | Koga | ............... | G01B 7/012 |

OTHER PUBLICATIONS

Chinese Office Action dated Jul. 3, 2020, issued in corresponding Application No. 201780032777.8, filed Apr. 18, 2017, 23 pages.

* cited by examiner

COORDINATE MEASUREMENT PROBE BODY

CROSS-REFERENCE TO RELATED APPLICATION

This application claims the benefit of Provisional Application No. 62/325,763, filed Apr. 21, 2016, the entire disclosure of which is hereby incorporated by reference herein.

BACKGROUND

Certain coordinate measurement systems, e.g., one-dimensional or three-dimensional measurement systems, such as coordinate measuring machines (CMM), obtain measurements of a workpiece using a touch probe configured to detect when a stylus of the touch probe contacts a workpiece. An exemplary prior art CMM described in U.S. Pat. No. 5,526,576, to Fuchs et al., which is hereby incorporated herein by reference in its entirety, includes a touch probe for contacting a workpiece, a movement mechanism comprising multiple drives for moving the touch probe, and an associated electronic system including features related to processing signals in or from the touch probe body or head.

Touch probes use various types of sensitive displacement sensors to sense deflection of the touch probe stylus for an indication that it has contacted a workpiece. In a touch probe it is desirable that the smallest deflection of the touch probe stylus be sensed from the smallest possible contact force.

An exemplary touch probe is disclosed in U.S. Pat. No. 5,755,038, to McMurtry, which is hereby incorporated by reference in its entirety. McMurtry discloses a touch probe having a touch probe body or sensing module that releasably engages a distal stylus module. As best understood, McMurtry discloses a probe body having a central resiliently supported moving load member that extends axially between three pillars comprising a rigid supporting structure surrounding the resiliently supported moving load member. Printed circuit boards including an application-specific integrated circuit ("ASIC") signal processor are mounted around the resiliently supported load member on the rigid supporting structure. The resiliently supported moving load member extends along substantially the entire length of the sensing module along its central axis, and is connected near an upper end of the rigid supporting structure to a resilient diaphragm. Three compliant struts connect the moving load member to a lower end of the rigid support structure. The struts each include a strain gauge connected to the ASIC signal processor to generate a trigger signal in response to movement of the load member relative to the rigid supporting structure. A configuration for a high precision touch probe body that is more economical to fabricate, assemble, and repair is desirable.

SUMMARY

This summary is provided to introduce a selection of concepts in a simplified form that are further described below in the Detailed Description. This summary is not intended to identify key features of the claimed subject matter, nor is it intended to be used as an aid in determining the scope of the claimed subject matter.

Prior art touch probe body configurations, including the probe body configuration indicated above, have been determined to have various undesirable aspects including: difficult assembly, inadequate or difficult testing of sub-systems prior to complete assembly, difficult post assembly testing and/or programming, and difficult post assembly repair. For example, compliant elements that suspend moving elements that support the stylus, are fragile and easily damaged. The strain gauges that may be mounted thereon are also fragile, and the strain gauge assembly is a low-yield operation. Prior art probe body configurations such as the one indicated above do not facilitate economical sub-assembly and sub-assembly verification prior to complete or nearly complete assembly. Consequently, yields may be low, completion of assembly complicated and expensive, and repair expensive or impractical. One factor hindering improved solutions to these problems has been that it has proved difficult to provide alternative configurations that achieve similar high accuracy measurements (e.g., micron or submicron level repeatability), in a similar compact configuration (e.g., on the order of 12-15 millimeter diameter, or about the size of a human "pinky" finger). The difficulty of creating improved solutions to these problems is further increased when it is desired to increase the electronic components and signal processing performed in the probe body itself.

The performance levels and miniaturization currently demanded in touch probe bodies forces tradeoffs between all elements combined in such devices: reducing structural stiffness allows deflection due to vibration which degrades accuracy, increasing stiffness adds material which reduces the space for electronic components and required moving elements, and so on. All of the foregoing complicates adding features that are convenient for subassembly and/or subassembly testing, and/or repair.

In contrast to the prior art, disclosed herein is a configuration for a touch probe body that includes a unique combination of features which solves the problems outlined above. In one embodiment, the probe body may have a relatively larger length dimension along the direction of a probe body axis and a relatively shorter cross-section dimension along a direction transverse to the probe body axis. The probe body may comprise: a rigid probe body structure comprising an upper mounting portion, an axial extension portion that extends along the direction of the probe body axis, and a compliant element mounting frame; a stylus suspension portion comprising a moving element that couples to a stylus, and a configuration of compliant elements arranged to suspend the moving element from the compliant element mounting frame; a displacement sensing configuration arranged to sense displacement of the moving element relative to at least one of the compliant element mounting frame and the rigid probe body structure, wherein the displacement sensing configuration comprises at least one displacement sensor that outputs a respective displacement signal; and a circuit board assembly comprising at least first, second, and third component mounting portions that are approximately planar portions that extend along the direction of the probe body axis. In various embodiments, the compliant elements arranged to suspend the moving element from the compliant element mounting frame are attached to an attachment portion of the compliant element mounting frame that is distally located relative to a distal end of the circuit board assembly, and the at least first, second, and third component mounting portions of the circuit board assembly are arranged around the axial extension portion of the rigid probe body structure and between the upper mounting portion and the attachment portion of the compliant element mounting frame.

In some embodiments, the at least first, second, and third component mounting portions are electrically interconnected with at least one flexible connector component such that the first, second, and third component mounting portions and the at least one flexible connector component form a foldable circuit board assembly. In some embodiments, the foldable circuit board assembly comprises a field programmable gate array, and an exposed end portion of the at least one flexible connector component comprises connection elements that are configured to provide programmable access to the field programmable gate array.

In some embodiments, all of the compliant elements that suspend the moving element from the compliant element mounting frame, and the attachment portion of the compliant element mounting frame, are distally located relative to a distal end of the circuit board assembly. In some embodiments, the compliant element mounting frame is coupled rigidly and releasably to the remainder of the rigid probe body structure (e.g., by a post in a hole) such that the moving element, all of the compliant elements that suspend the moving element from the compliant element mounting frame, the displacement sensing configuration, and the compliant element mounting frame form a suspension module that is separable from the remainder of the rigid probe body assembly. In some embodiments, a flexible circuit connector is operably connected to the at least one displacement sensor and extends from the displacement sensing configuration to releasably engage the circuit board assembly configuration at a mating connector.

In some embodiments, the configuration of compliant elements comprises a first flexure configuration formed in a first planar element, connecting a central region to a peripheral region of the first planar element, and a second flexure configuration formed in a second planar element connecting a central region to a peripheral region of the second planar element, wherein the central regions of the first and second planar elements are coupled to the moving element and the peripheral regions of the first and second planar elements are coupled to the attachment portion of the compliant element mounting frame.

In some embodiments, the at least first, second, and third component mounting portions of the circuit board assembly consist of three component mounting boards, and the axial extension portion defines three faces, wherein each of the three component mounting boards are sized to overlie a respective one of the three faces. The axial extension portion of the rigid probe body structure may be a monolithic element located along its central axis. The first, second, and third component mounting portions may be flexibly connected and foldable to form a structure having an approximately triangular cross section.

DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION

Illustrative embodiments will be described to assist in better understanding the various aspects of the present invention. Methods and apparatuses described herein are intended as exemplary embodiments, and are not intended to be interpreted restrictively. Reference numbers with similar suffixes (e.g., 1XX and 3XX), may identify analogous elements in various figures, unless otherwise indicated by context or description.

Figure 1:
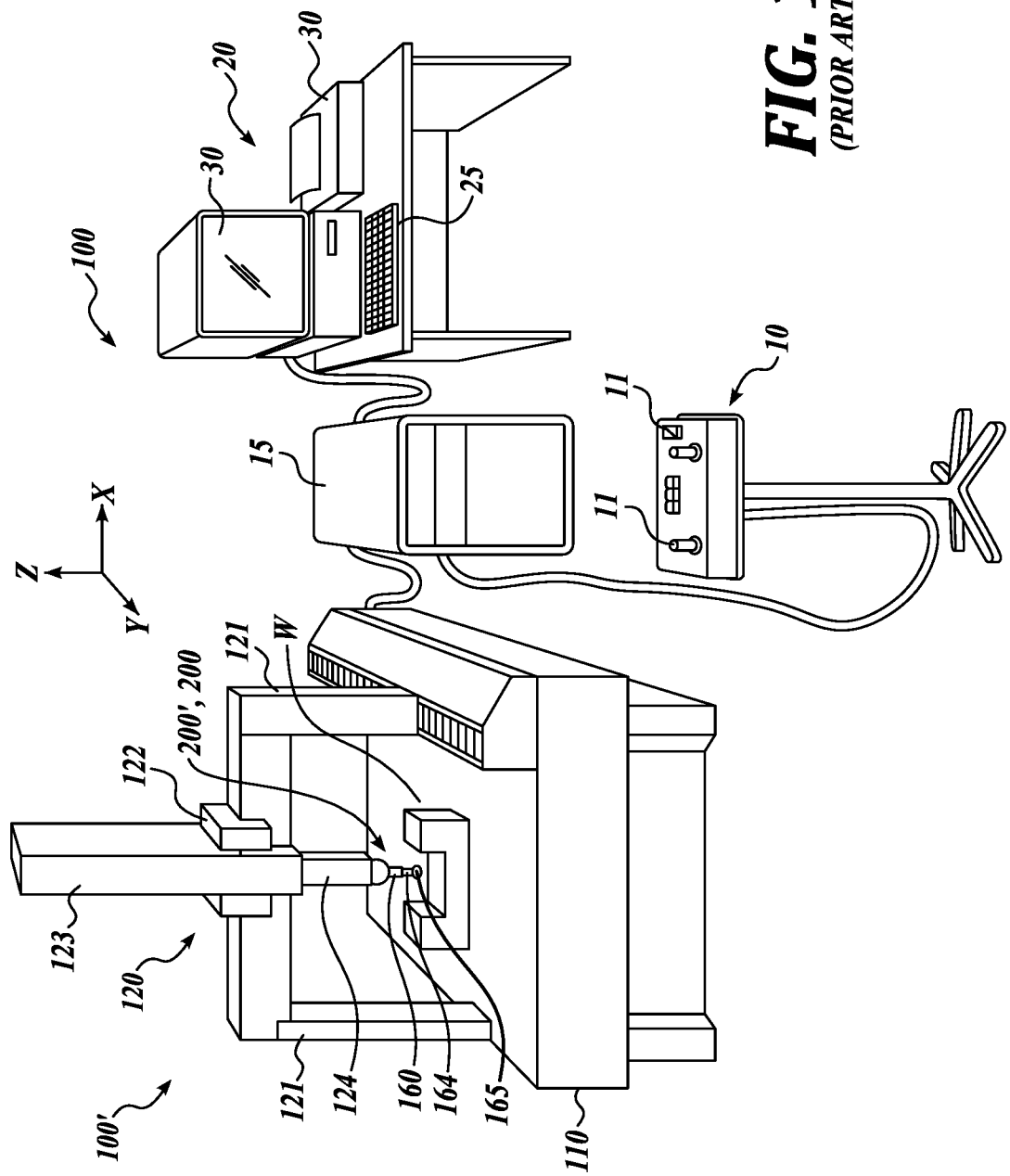
FIG. 1 illustrates a prior art coordinate measuring machine suitable for use with embodiments of the present invention.

Coordinate measuring machines (CMMs) are known in the art, for example, in U.S. Pat. Appl. Publ. No. 2011/0192044, to Usui, which is hereby incorporated by reference in its entirety. A typical arrangement of a known CMM is illustrated schematically in FIG. 1, showing a measuring system 100 including a CMM 100', which uses a touch probe 200'. The touch probe 200' may include a novel probe body 200 having a configuration such as that disclosed herein. The measuring system 100 includes an operating unit 10, a motion controller 15 that controls movements of the CMM 100', a host computer 20, and the CMM 100'. The operating unit 10 is coupled to the motion controller 15 and may include one or more joysticks 11 for manually operating the CMM 100'. The host computer 20 is coupled to the motion controller 15 and operates the CMM 100' and processes measurement data for a workpiece W according to known methods. The host computer 20 includes input means 25 (e.g., a keyboard, etc.) for inputting, for example, measurement conditions, and output means 30 (e.g., a display, printer, etc.) for outputting, for example, measurement results.

The CMM 100' includes a drive mechanism 120 which is located on a surface plate 110, and an attachment portion 124 for attaching the touch probe 200' to the drive mechanism 120. The drive mechanism 120 includes x-axis, y-axis, and z-axis slide mechanisms 122, 121, and 123, respectively, for moving the touch probe 200' three-dimensionally. A stylus 164 attached to the touch probe 200' includes a contact portion 165. As will be described in more detail below, a stylus module 160 attaches the stylus 164 to a stylus suspension portion of the touch probe body 200, which allows the stylus 164 to deflect when its contact portion 165 contacts the surface of the workpiece W, to produce a trigger touch signal as desired. The characteristics and operations of many commercially available CMMs are generally known in the art, and are therefore not described in greater detail here.

Regarding the touch probe 200', it provides a 3D tactile probing system having characteristics such as general mechanical stiffness and signal sensitivity to the deflection of the stylus 164, so that the characteristics can be reliably trusted to properly reflect the actual coordinates measured by the probing system. Such a 3D tactile probing system may allow high precision tactile measurements in three dimensions, with repeatability at the submicron level, and using low probing forces. For economical high throughput, it may be generally desirable to perform all operations (e.g., motions and sensing) of the CMM 100' at high speed. An exemplary embodiment of a high speed contact detector is disclosed in U.S. Pat. Appl. Publ. No. 2015/0323300, to Briegel et al., which is hereby incorporated by reference in its entirety.

It will be appreciated that operating at high speeds, for example, detecting surfaces at thousands of touches per hour, may require the two-way transmission of large amounts of data between the coordinate measuring probe body 200 and the host computer system 20. In some cases, the data transmission requirements may limit the rate at which such measurements can be taken. It would be beneficial if at least some of the data generated by the touch probe 200' were processed at the probe body 200, to reduce the amount of data that must be transmitted to the computer system 20. However, during high-speed operations the coordinate measuring probe body 200 is accelerated very rapidly. These high accelerations, in combination with the increased mass of signal processing electronics and the reduced structural stiffness associated with removing material in the probe body 200 to accommodate increased electronics, have previously limited the ability to integrate more comprehensive signal processing systems into a CMM "integrated" probe body 200 while retaining other desirable characteristics (e.g., sufficient mechanical stiffness, economical assembly, and other desirable characteristics outlined previously). Embodiments including a combination of features that overcome these problems and provide particular advantages are described below.

Figure 2:
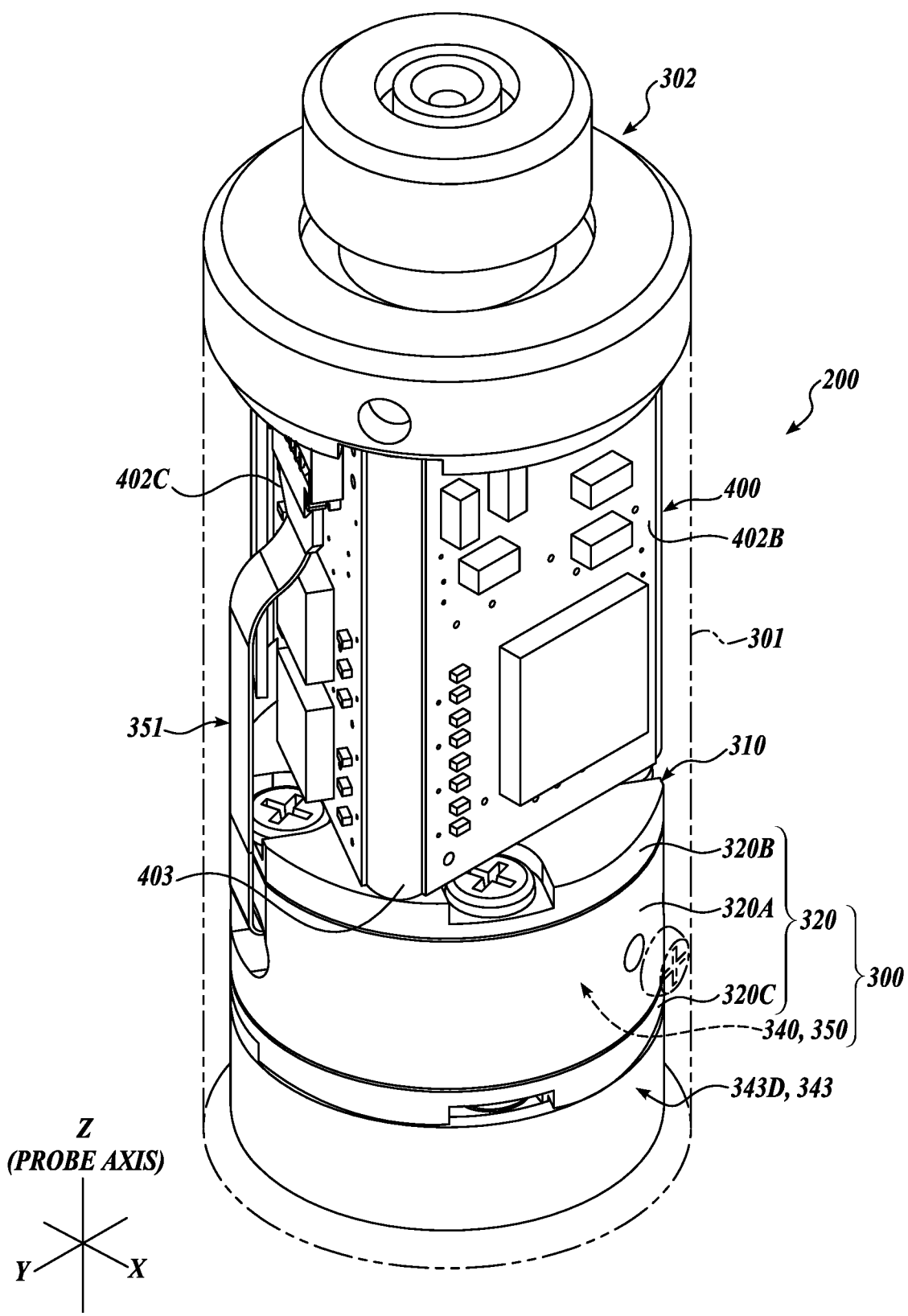
FIG. 2 is a perspective view of an embodiment of a coordinate measuring probe body in accordance with the present invention with the housing shown in phantom.
Figure 3:
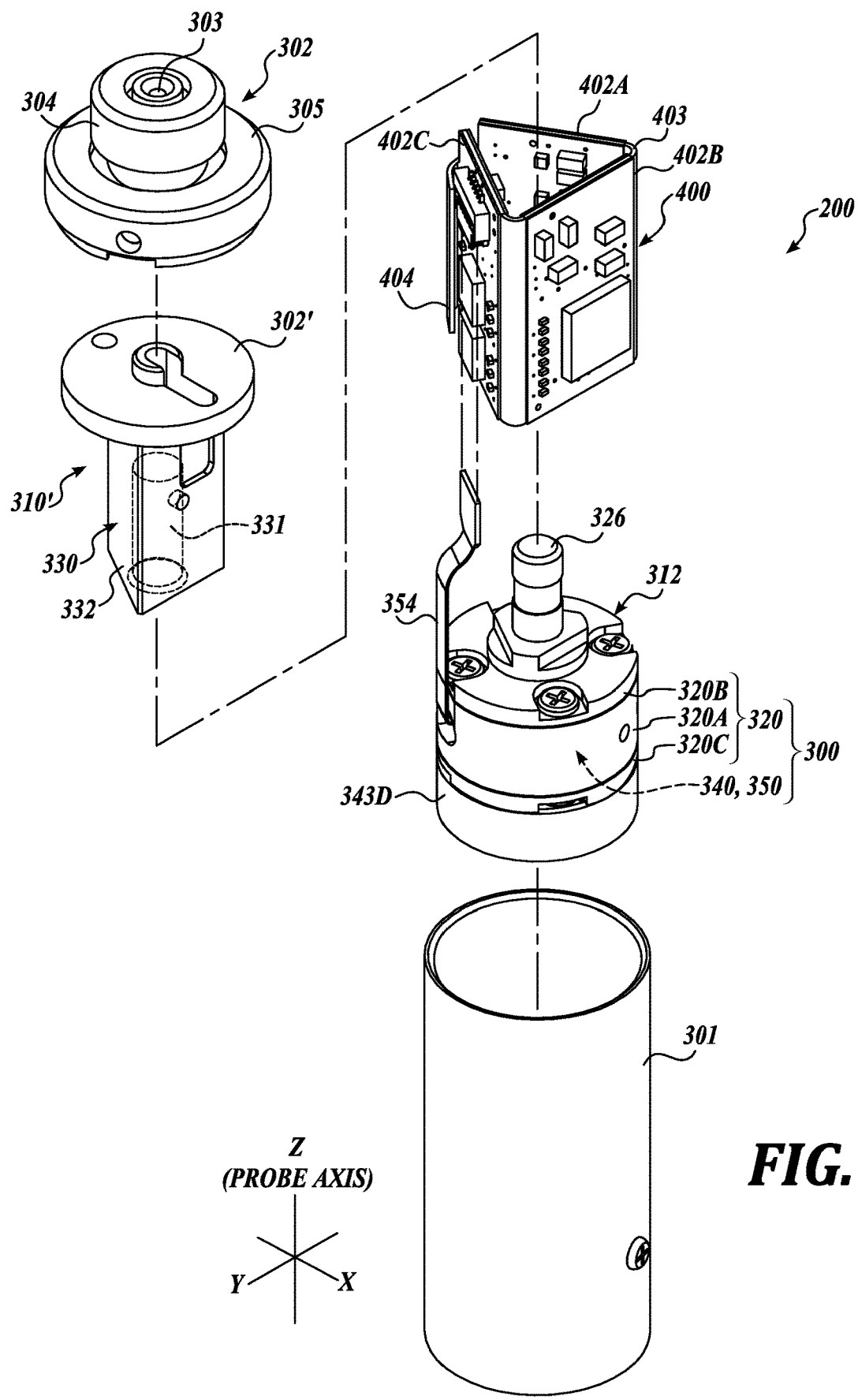
FIG. 3 is a partially exploded view of the coordinate measuring probe body shown in FIG. 2.
Figure 4:
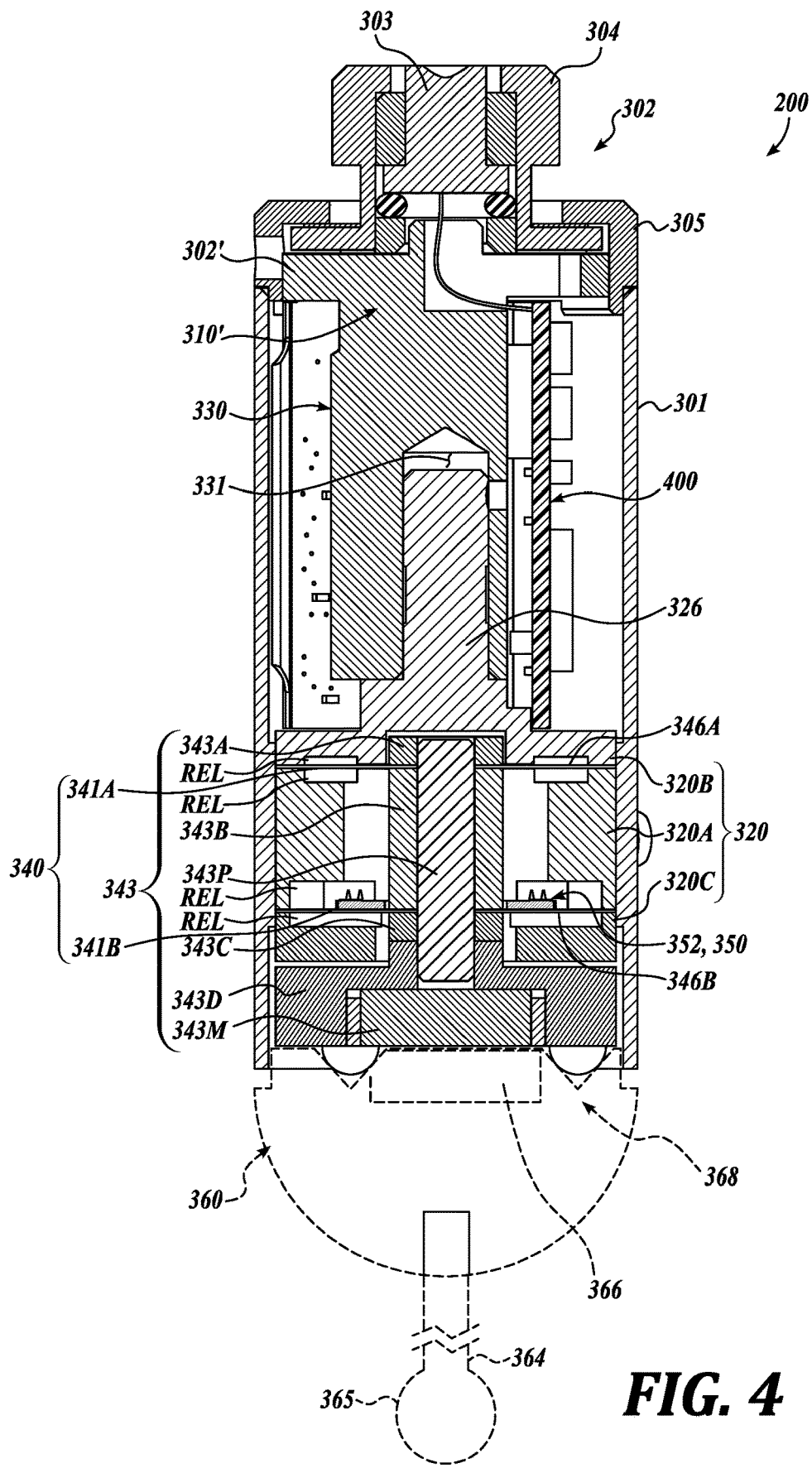
FIG. 4 is a cross-sectional view of the coordinate measuring probe body shown in FIG. 2, and showing a schematically illustrated stylus module in phantom.

FIGS. 2, 3, and 4 show an embodiment of an integrated coordinate measuring probe body 200. FIG. 2 is a perspective view of an embodiment of the integrated coordinate measuring probe body 200 with a housing 301 shown in phantom to reveal a circuit board assembly configuration 400 and a moving element assembly 300 disposed in the housing 301. FIG. 3 is a partially exploded view of the coordinate measuring probe body 200 shown in FIG. 2, and FIG. 4 is a cross-sectional view of the coordinate measuring probe body 200 shown in FIG. 2, also showing a schematically illustrated stylus module 360 in phantom.

The probe body 200 in this embodiment includes the housing 301, a connection assembly 302 configured for connecting the integrated coordinate measuring probe body 200 to a measuring system such as a CMM (not shown, see, for example, the CMM shown in FIG. 1); a rigid probe body structure 310, a circuit board assembly configuration 400, and a moving element assembly 300 comprising a compliant element mounting frame 320, a stylus suspension portion 340, and a displacement sensing configuration 350 mounted in the compliant element mounting frame 320, all described in greater detail below.

The rigid probe body structure 310 includes main member 310' including an upper mounting portion 302' and an axial extension portion 330 having a bore 331 extending along the axial direction. The compliant element mounting frame 320 is joined to, and forms an additional part of, the rigid probe body structure 310. The compliant element mounting frame 320 includes a central portion 320A, an upper portion 320B and a lower portion 320C, which are clamped together by screws 329 in this embodiment. The upper portion 320B includes a post portion 326 that is clamped, screwed, or otherwise removably fastened by known means in the bore 331, for rigid attachment to the axial extension portion 330. As previously outlined, various compliant and/or moving elements and associated sensing elements are assembled inside the compliant element mounting frame 320, to form the moving element assembly 300, as described in greater detail below with reference to FIG. 4 and FIG. 5. The moving element assembly 300 is easily assembled and tested as a unit, and is easily replaced in the probe body 200.

In this embodiment, the axial extension portion 330 includes an axial member 332 that has a triangular cross section that is sized to receive the circuit board assembly configuration 400 with component mounting portions 402A, 402B, 402C (FIG. 6) generally aligned to overlie a face of the axial extension portion 330. Although three component mounting portions 402A, 402B, 402C are shown in this embodiment, the circuit board assembly configuration may alternatively comprise more or fewer component mounting portions. For example, in an embodiment a fourth component mounting portion is included, and the axial member may have a rectangular or square cross section. In some embodiments, when the probe body 200 is assembled, the circuit board assembly configuration 400 is securely disposed and supported within the housing 301, between the upper mounting portion 302' and the upper portion 320B of the compliant element mounting frame 320. As described in detail with reference to FIG. 5, the moving element assembly 300 includes compliant elements 341 that are attached (e.g., clamped) to attachment portions of the compliant element mounting frame 320 near its peripheral region (e.g., just inside the circumference of the main body of the illustrated moving element assembly 300.) In various embodiments, the circuit board assembly configuration 400 engages only rigid portions of the rigid probe body structure 310. All of the moving assembly, first and second compliant elements 341A, 341B, and their corresponding attachment portions are disposed distally from the circuit board assembly configuration 400. Thus, the illustrated embodiment teaches a particularly advantageous combination of elements, wherein the structural elements of the probe body 200 are both economical and have high rigidity, and the compliant elements 341A, 341B and the circuit board assembly configuration 400 are arranged in an easily assembled and accessible location in the probe body 200.

The illustrated embodiment is exemplary only. For example, in various alternative embodiments, the axial member 332 may be formed as a separate element from the upper mounting portion 302', for example, formed integrally with the upper portion 320B, so there is no need for the post portion 326, and the upper mounting portion 302' may be threadably or otherwise fixed to a proximal end of the axial member 332. In the illustrated embodiment, as best seen in FIGS. 3 and 4, the connection assembly 302 includes an interlock collar 304 and a schematically illustrated electrical connector portion 303 for rigidly connecting the probe body 200 and its circuitry to a CMM 100'. The connection assembly 302 connects to the housing 301 at an annular housing cap portion 305. In various embodiments the upper mounting portion 302' may be attached to the housing cap portion 305 by known methods, or they may be merged and/or indistinguishable.

Figure 5:
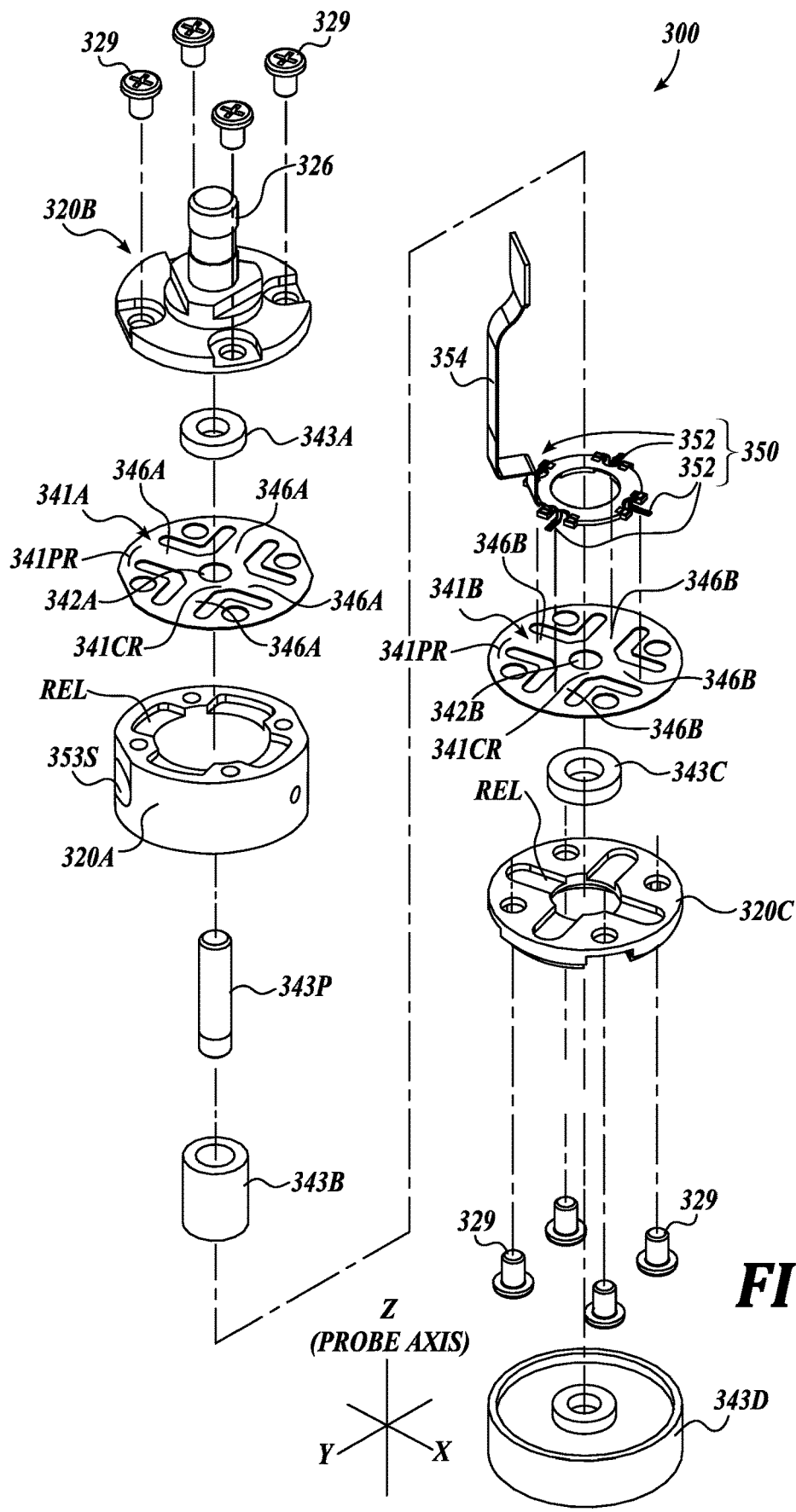
FIG. 5 is an exploded view of the moving element assembly shown in FIGS. 2, 3, and 4, including a compliant element mounting frame that is part of a rigid probe structure, and associated elements assembled therein.

FIG. 5 is an exploded view of one embodiment of the moving element assembly 300 shown in FIGS. 2, 3, and 4, which in this embodiment includes the compliant element mounting frame portions 320 A, 320B, 320C, the stylus suspension portion 340 and the displacement sensing configuration 350. The probe body 200 is shown assembled in cross-sectional view in FIG. 4.

The compliant element mounting frame 320 is a rigid frame that forms one portion of the overall rigid probe body structure 310. In the illustrated embodiment the compliant element mounting frame 320 includes the central portion 320A, the upper portion 320B, and the lower portion 320C, which are clamped together by screws 329 in this embodiment. The first compliant element 341A is thereby clamped between the central portion 320A and the upper portion 320B, which have surface reliefs REL configured such that the clamping occurs at the outer perimeters of the central portion 320A and the upper portion 320B, which corresponds with a peripheral region 341PR of the first compliant element 341A. Similarly, the second compliant element 341B is clamped between the central portion 320A and the lower portion 320C, which also have surface reliefs REL configured such that the clamping occurs at the outer perimeters of the central portion 320A and the lower portion 320C, which corresponds with a peripheral region 341PR of the second compliant element 341B. The surface reliefs REL are configured such that the central regions 341CR of the first and second compliant elements 341A, 341B, as well as their flexure portions 346A, 346B, are free to deflect along the axial direction of the probe body 200. The surface relief REL on the lower face of the central portion 320A also provides clearance for the displacement sensing configuration 350 and associated connection elements.

The stylus suspension portion 340 comprises the configuration of compliant elements 341A, 341B, which include flexure portions 346A, 346B arranged to suspend the moving assembly 343 from the compliant element mounting frame 320. The moving assembly 343 comprises a pin 343P, first, second, and third clamping rings 343A, 343B, and 343C, respectively, and a stylus capture element 343D which couples to an interchangeable stylus module 360. The pin 343P extends through the center apertures 342A, 342B of the deflectable central regions 341CR of the substantially planar and parallel compliant elements 341A and 341B. The first and second clamping rings 343A and 343B are pressed or otherwise fastened or bonded onto the pin 343P and clamped or bonded to the deflectable central region 341CR of the compliant elements 341A. Similarly, the second and third clamping rings 343B and 343C are pressed or otherwise fastened onto the pin 343P and clamped or bonded to the deflectable central region 341CR of the compliant elements 341B. The stylus capture element 343D is pressed or otherwise fastened onto the distal end of the pin 343P. The stylus capture element 343D is configured to engage an interchangeable stylus module 360 (shown in phantom in FIG. 4), using known techniques. For example, as best seen in FIG. 4 the stylus capture element 343D includes a magnet 343M and kinematic mounting features that mate to a magnet 366 and a mating kinematic mounting arrangement 368 on the interchangeable stylus module 360, such that it is easily detached and exchanged by overcoming the magnetic force. However, as a result of the magnets and the stable mating kinematic mounting arrangements, during operation the moving assembly 343 (and the associated displacement sensing configuration 350, described below) is fixed to the interchangeable stylus module 360 in a repeatable and stable manner, and will react with a displacement to produce a contact signal when the contact portion 365 of the stylus 364 contacts a surface to be measured.

In this exemplary implementation of the displacement sensing configuration 350 and the associated compliant element 341B shown in FIG. 4 and FIG. 5, each of the flexure portions 346B has a corresponding strain gauge type displacement sensor 352 bonded to it to detect its strain and/or displacement in response or a motion of the stylus 364, to produce a corresponding displacement signal. It will be understood that the displacement sensors 352 are in signal communication with the circuit board assembly configuration 400 through individual conductive traces (not shown) included in a flexible conductor connector 354 (best seen in FIG. 5). For example, a ring shaped sensor connector portion 353 of the flexible conductor connector 354 may be bonded to a non-moving part of the compliant element 341B, and may provide clearance relative to the deflectable central region 341CR of the compliant element 341B. Wire bonds between individual conductive traces (not shown) on the sensor connector portion 353 and the displacement sensors 352 may be compliant, so as not to inhibit the deflection of the compliant element 341B. Although four displacement sensors 352 are shown, more or fewer displacement sensors 352 may be used, and may have advantages in particular applications.

Figure 6:
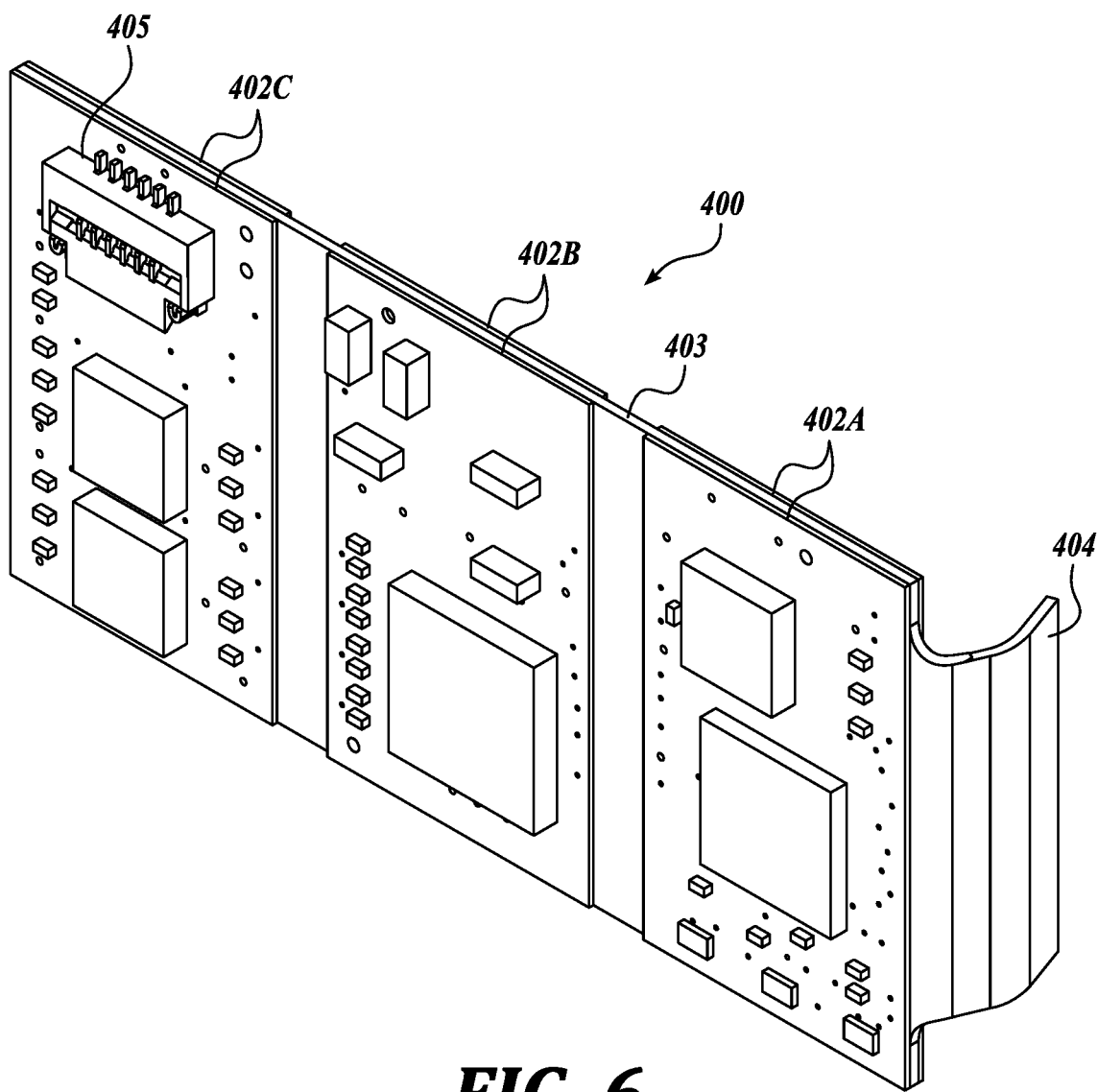
FIG. 6 is a perspective view of the circuit board assembly configuration for the coordinate measuring probe body shown in FIGS. 2, 3, and 4.

FIG. 6 is a perspective view of one embodiment of the circuit board assembly configuration 400 including a plurality of planar component mounting portions, as shown in FIGS. 2, 3, and 4. In this embodiment the circuit board assembly 400 includes, for example, a first component mounting portion 402A, a second component mounting portion 402B, and a third component mounting portion 402C. For ease of manufacturing and assembly, the component mounting portions 402A, 402B, and 402C may be substantially planar. Although three component mounting portions are shown, it will be appreciated that more or fewer component mounting portions may be included in various embodiments.

The component mounting portions 402A, 402B, and 402C are connected physically and electronically with a flexible circuit member 403. Therefore, the circuit board assembly 400 may be foldable. The component mounting portions 402A, 402B, and 402C may have mounting surfaces on one or both sides of the flexible circuit member 403 (both sides shown). For example, the component mounting portions 402A, 402B, and 402C in some embodiments comprises laminated multi-layer circuit boards with outer rigid layers for mounting components and a shared flexible center layer. FIG. 6 illustrates the circuit board assembly configuration 400 unfolded, to show particular features of the configuration 400. In a particular embodiment one of the component mounting portions 402C includes a connector 405 configured to connect with the flexible conductor connector 354 (FIG. 4), to receive signals from the displacement sensors 352 of the displacement sensing configuration 350.

In some embodiments, the features of the configuration 400 allow component placement and routing that is advantageous for separating sensitive analog signals from potentially disruptive digital signals. Persons of skill in the art will appreciate that separating the circuit board assembly configuration 400 into primarily analog and primarily digital domains may minimize crosstalk and interference. For example, the third component mounting portion 402C may be configured primarily to receive analog signals from the displacement sensing configuration 350, and/or to generate and/or amplify and/or filter these and other analog signals, if desired. The second component mounting portion 402B may include power input and conditioning components, and may also receive the processed signals from the third component mounting portion 402C through the flexible circuit member 403, and may further process the signals (e.g., to provide a particular desired set of digital signals). The digital signals may then be transmitted from the second component mounting portion 402B to the first component mounting portion 402A through the flexible circuit member 403 for additional processing and analysis. However, this component layout on the various mounting portions is exemplary only, and not limiting.

In this embodiment, one end of the flexible circuit member 403 comprises a flex tab or connector 404, including a plurality of contact or connection elements (not shown) to permit the circuit board assembly configuration 400 to be connected to a testing and/or reprogramming system (not shown). For example, this greatly simplifies testing the circuit board assembly configuration 400 prior to installation, and additionally allows a more comprehensive set of test or connection points to be accessed, without a substantial penalty in cost or in volume in the probe body 200. Moreover, it will be appreciated from previous description that the coordinate measuring probe body 200 may have certain portions or modules replaced or repaired, and in this embodiment can be readily disassembled to provide access to the circuit board assembly configuration 400. This aspect allows the coordinate measuring probe body 200 to be readily tested and upgraded according to need or opportunity. The probe body 200 may be updated by replacing the circuit board assembly configuration 400 or, in some embodiments, by reprogramming the circuit board assembly configuration 400 via connections to the electronics (which may include, for example, field programmable gate arrays) through the flex tab or connector 404.

Figure 7:
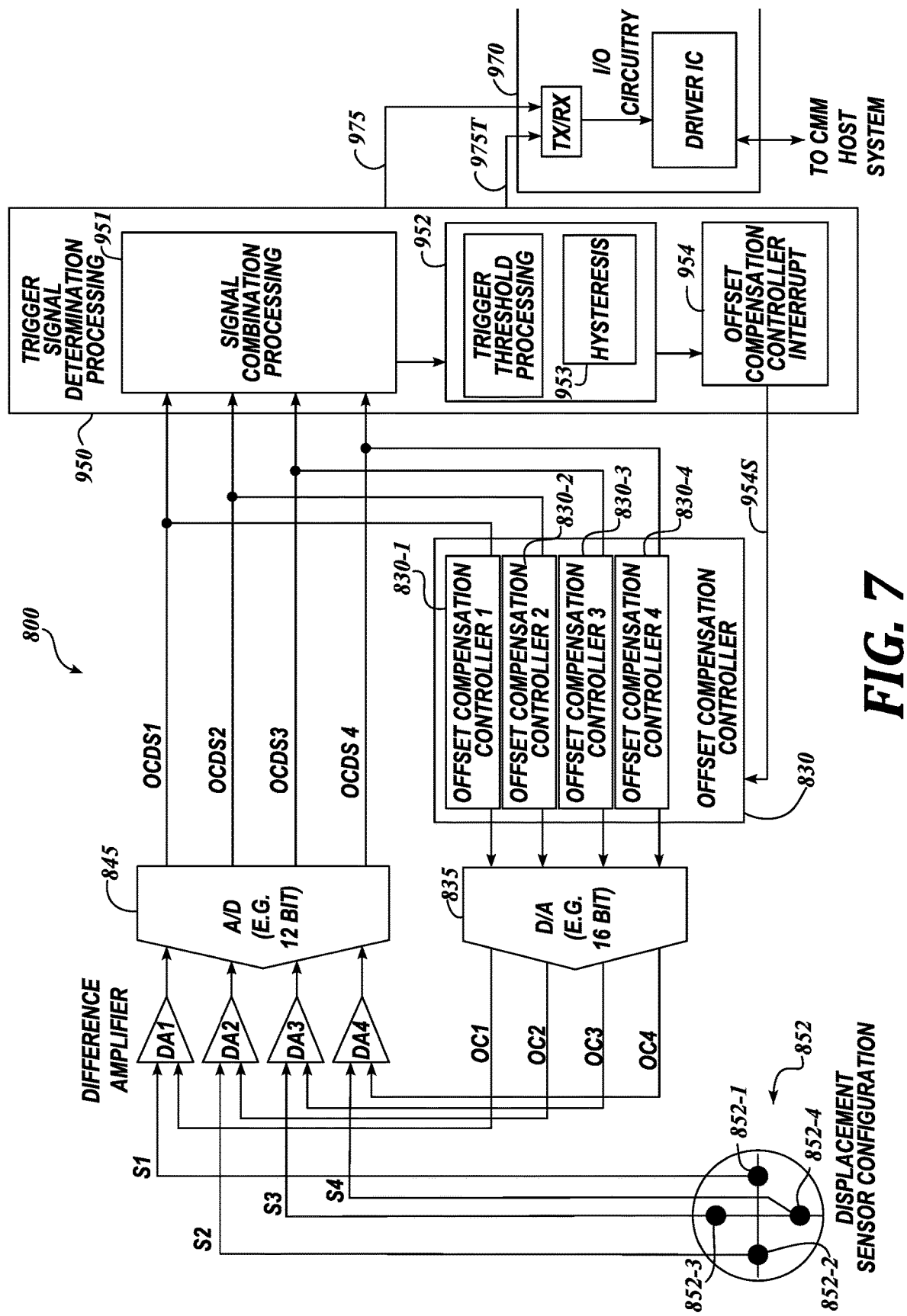
FIG. 7 is a block diagram showing various elements of a one implementation of an electronic system as may be included in a circuit board assembly configuration shown in FIG. 6.

FIG. 7 is a block diagram showing various elements of one implementation of a touch probe circuit 800, which may be included in the circuit board assembly configuration 400 shown in FIG. 6. The inventors have found that the configuration of the compact probe body 200 allows corresponding components to be assembled in the circuit board assembly configuration 400 (e.g., in a compact diameter of 12-15 millimeters, for example) to provide an unprecedented scope of signal processing operations in the probe, for example, corresponding to the following description, using economical non-custom components. The touch probe circuit 800 is described relatively briefly below. Additional details may be found in commonly assigned U.S. Patent Application No. 62/271,082, which is hereby incorporated herein by reference in its entirety.

In the implementation shown in FIG. 7, the touch probe circuit 800 comprises a sensor assembly 852 having a plurality of displacement sensors 852-1 through 852-4, an offset compensation controller 830 comprising a plurality of individual offset compensation controller portions 830-1 through 830-4, and a plurality of difference amplifiers DA1 through DA4. It will be understood that the various elements with a similar "X" or "–X" designation (e.g., X=1, etc.) work together as implied by the connections shown in the figure to form individual touch probe circuit "channels" that may each operate in a manner similar to that described for "channel X=1" below.

In operation, the displacement sensor 852-1 is configured to output a sensor signal S1 that is responsive to displacement of a stylus (e.g., the stylus 364). The offset compensation controller portion 830-1 is configured to output a varying offset compensation signal OC1 (e.g., through the D/A converter 835, which in some embodiments is considered to be part of the offset compensation controller 830 and/or the offset compensation controller portion 830-1). The varying offset compensation signal OC1 from the offset compensation controller portion 830-1 is used to compensate for variation in a rest-state signal component output by the displacement sensor 852-1, as describe in greater detail below. The difference amplifier DA1 is connected to input the offset compensation signal OC1 from the offset compensation controller portion 830-1 and the displacement sensor signal S1, and to amplify the difference between the input signals. The amplified difference is output from the difference amplifier DA1 as an offset compensated displacement signal OCDS1 (e.g., through the A/D converter 845).

The offset compensated displacement signal OCDS1 may be output through the A/D converter 845 to the trigger signal determination processing circuit 950, to contribute to the determination of a touch trigger signal (e.g., the signal 975T) for the touch probe, as described in greater detail below. The offset compensated displacement signal OCDS1 is also output through the A/D converter 845 to be input to the offset compensation controller portion 830-1 for use in adjusting the offset compensation signal that it outputs. In particular, the offset compensation controller portion 830-1 is configured to provide a feedback loop that inputs the offset compensated displacement signal OCDS1 and responds to that input to generate a low pass filtered offset compensation signal OC1 (e.g., through the D/A converter 835) that is input to the difference amplifier DA1 to compensate the offset in the displacement sensor signal S1 due to the rest-state signal component. Using this type of feedback loop to generate and apply a low pass filtered offset compensation signal OC1 at the difference amplifier DA1 has advantages in comparison to various known prior art methods of compensating the more slowly changing rest state signal drift component(s) in a displacement sensor signal in order to isolate the more rapidly changing workpiece contact signal component(s) in the displacement sensor signal.

The touch probe circuit 800 may generally be implemented in either analog or digital circuits, or combination thereof. In various partially or completely analog circuit implementations the D/A converter 835 and/or the A/D converter 845 may be omitted. However, in various implementations, a digital circuit implementation of the offset compensation controller 830 and/or the offset compensation controller portion 830-1 may have advantages. In such an implementation the touch probe circuit 800 may then advantageously comprise the A/D converter 845 and/or the D/A converter 835. In various implementations, the A/D converter 845 and/or the D/A converter 835 may convert a plurality of channels in parallel through parallel converter channels, or in other implementations they may multiplex the various channels for sequential conversion if the associated processing time is allowable in a particular implementation.

In various implementations the A/D converter 845 may nominally operate at M bits of resolution. The difference amplifier DA1 may comprise an analog amplifier configured to output the offset compensated displacement signal OCDS1 to the A/D converter 845, which is configured to convert the offset compensated displacement signal OCDS1 into a corresponding digital offset compensated displacement signal OCDS1 that is output to the trigger signal determination processing circuit 950, and that is also input to the offset compensation controller portion 830-1 for use in adjusting the offset compensation signal OC1. In various implementations, the offset compensation controller portion 830-1 comprises the D/A converter 835 nominally operating at N bits of resolution, the offset compensation controller portion 830-1 comprises a digital circuit configured to input the digital offset compensated displacement signal OCDS1 and determine the value of a low pass filtered digital offset compensation signal OC1 that is input to the D/A converter 835, and the D/A converter 835 is configured to convert the low pass filtered digital offset compensation signal OC1 into a corresponding low pass filtered analog offset compensation signal OC1 that is input to an analog difference amplifier DA1. In various implementations, it may be advantageous if N is at least 8 bits larger than M. This may be advantageous because, as previously indicated, for various types of displacement sensors and/or their implementations in a touch probe, variations in a rest-state signal component output by the displacement sensor (e.g., various kinds of sensor signal "drift") can often exceed the variation in the displacement sensor signal due to the allowed amount of stylus deflection. This means that the low pass filtered analog offset compensation signal OC1 may be a large value. In contrast, the processing provided by the difference amplifier DA1, removes the large value of the low pass filtered analog offset compensation signal OC1 from its output, outputting only a relatively smaller valued signal offset compensated (analog) displacement signal OCDS1 (the displacement sensor signal due to the allowed amount of stylus deflection). As a result, in order to provide comparable signal resolution in the signals output from the D/A converter 835 and the A/D converter 845, it may be both most economical and advantageous in various implementations if N is at least 8 bits larger than M.

The trigger signal determination processing circuit 950 may be implemented according to principles known to one skilled in the art of touch probe design. Therefore, it is only briefly described briefly here in one exemplary implementation. As shown in FIG. 7, it may be desirable to combine a plurality of displacement sensor signals in order to provide a combined signal that is compared to a touch trigger signal switching threshold. Thus, as shown in FIG. 7, the trigger signal determination processing circuit 950 inputs four individual offset compensated digital displacement signals OCDS1-OSDS4, and includes a signal combination processing portion 951 that determines a combined displacement signal which is provided to a trigger threshold processing circuit 952. The trigger threshold processing circuit 952 defines a switching threshold value which is compared to the combined displacement signal. When the combined displacement signal exceeds the switching threshold value, the trigger threshold processing circuit 952 outputs a touch trigger signal 975T indicating the stylus has contacted a workpiece. The touch trigger signal 975T is communicated to a CMM host system or the like, e.g., through I/O circuitry 970, so that current measurement values in the host system can be recorded to indicate the present coordinates of the stylus and the measurement coordinates of the workpiece surface that it is contacting. The I/O circuitry 970 may also pass other control signals and/or parameters 975 between the host system and the trigger signal determination processing circuit 950, and/or various element of the touch probe circuit 800, in various embodiments. The trigger threshold processing circuit 952 may include a known type of hysteresis circuit 953, which implements hysteresis in relation to the defined switching threshold value, to prevent the touch trigger signal 975T from dithering on and off when the stylus is marginally contacting/not-contacting a workpiece surface.

The trigger signal determination processing circuit 950 may further include an offset compensation controller interrupt signal generating circuit 954, which may receive the touch trigger signal touch trigger signal 975T or a related signal from the trigger threshold processing circuit 952, and send an interrupt signal 954S to the offset compensation controller 830 to interrupt or freeze its effects. This ensures that the offset compensation controller 830 does not operate to compensate a displacement sensor signal variation due to a sustained workpiece contact signal component(s) in the displacement sensor signal, which would be improper operation.

The foregoing outline of exemplary operations of the trigger signal determination processing circuit 950 may be further understood and implemented based on study and application of various relevant materials currently available in the art of touch probe design. For example, one exemplary trigger signal determination processing circuit and method, including methods of signal combination processing as well as switching threshold definition, is described in U.S. Pat. No. 7,792,654, which is hereby incorporated herein by reference in its entirety.

While illustrative embodiments have been illustrated and described, it will be appreciated that various changes can be made therein without departing from the spirit and scope of the invention.

The invention claimed is:

1. A configuration for a coordinate measuring probe body having a relatively larger length dimension along the direction of a probe body axis and a relatively shorter cross-section dimension along a direction transverse to the probe body axis, the coordinate measuring probe body comprising:
a rigid probe body structure comprising an upper mounting portion, an axial extension portion that extends along the direction of the probe body axis, and a compliant element mounting frame;
a stylus suspension portion comprising:
a moving element that couples to a stylus, and a configuration of compliant elements arranged to suspend the moving element from the compliant element mounting frame;
a displacement sensing configuration arranged to sense displacement of the moving element relative to at least one of the compliant element mounting frame and the rigid probe body structure, the displacement sensing configuration comprising at least one displacement sensor that outputs a respective displacement signal; and
a circuit board assembly comprising at least first, second, and third component mounting portions that are approximately planar portions and that extend along the direction of the probe body axis;
wherein the configuration of compliant elements arranged to suspend the moving element from the compliant element mounting frame are attached to an attachment portion of the compliant element mounting frame that is distally located relative to a distal end of the circuit board assembly; and
wherein the at least first, second, and third component mounting portions of the circuit board assembly are arranged around the axial extension portion of the rigid probe body structure and between the upper mounting portion and the attachment portion of the compliant element mounting frame.

2. The configuration of claim 1, wherein the at least first, second, and third component mounting portions are electrically interconnected with at least one flexible connector component such that the first, second, and third component mounting portions and the at least one flexible connector component form a foldable circuit board assembly.

3. The configuration of claim 2, wherein one of the first, second, and third component mounting portions further comprises a field programmable gate array mounted thereon, and further wherein an end portion of the at least one flexible connector component extends beyond the first, second, and third component mounting portions and comprises connection elements that are configured to provide programmable access to the field programmable gate array.

4. The configuration of claim 2, wherein the circuit board assembly consists of the first, second, and third component mounting portions interconnected with the flexible connector component such that the circuit board assembly is foldable to form a structure having an approximately triangular cross section, and further wherein the axial extension portion of the rigid probe body structure has an approximately triangular cross section.

5. The configuration of claim 1, wherein the at least first, second, and third component mounting portions comprise rigid layers of a multi-layer circuit board and they are electrically interconnected with a shared flexible layer comprising a flexible circuit member.

6. The configuration of claim 1, wherein all of the compliant elements that suspend the moving element from the compliant element mounting frame, and the attachment portion of the compliant element mounting frame, are distally located relative to the distal end of the circuit board assembly.

7. The configuration of claim 6, wherein the compliant element mounting frame is coupled rigidly and releasably to the remainder of the rigid probe body structure such that the moving element, all of the compliant elements that suspend the moving element from the compliant element mounting frame, the displacement sensing configuration, and the compliant element mounting frame form a suspension module that is separable from the remainder of the rigid probe body structure.

8. The configuration of claim 6, wherein the compliant element mounting frame includes a post portion, and the axial extension portion of the rigid probe body structure includes a bore configured to receive the post portion.

9. The configuration of claim 8, further comprising a flexible circuit connector that is operably connected to the at least one displacement sensor and extends from the displacement sensing configuration to releasably engage the circuit board assembly at a mating connector on one of the first, second, and third component mounting portions.

10. The configuration of claim 6, wherein the compliant element mounting frame includes a post portion and the axial extension portion of the rigid probe body structure is threadably attached to the post portion.

11. The configuration of claim 1, wherein the configuration of compliant elements comprises:
 a first flexure configuration formed in a first planar element, the first flexure configuration connecting a central region of the first planar element to a peripheral region of the first planar element;
 a second flexure configuration formed in a second planar element, the second flexure configuration connecting a central region of the second planar element and a peripheral region of the second planar element; and
 wherein the central regions of the first and second planar elements are coupled to the moving element and the peripheral regions of the first and second planar elements are coupled to the attachment portion of the compliant element mounting frame.

12. The configuration of claim 1, wherein the first component mounting portion comprises analog components that process analog signals, and the third component mounting portion comprises only digital signal processing components.

13. The configuration of claim 1, wherein the at least first, second, and third component mounting portions of the circuit board assembly consist of three component mounting boards, and the axial extension portion of the rigid probe body structure defines three faces, wherein each of the three component mounting boards are sized to overlie a respective one of the three faces.

14. The configuration of claim 1, wherein the axial extension portion of the rigid probe body structure is a monolithic element located along the coordinate measuring probe body axis.

15. The configuration of claim 1, wherein the at least first, second, and third component mounting portions comprise first, second, third, and fourth component mounting portions that are approximately planar portions and that are relatively longer along the direction of the probe body axis and relatively narrower along a direction transverse to the probe body axis.

16. A coordinate measuring probe body comprising:
 a rigid probe body structure comprising a mounting portion, an axial extension portion that extends along a probe body axis, and a compliant element mounting frame;
 a stylus suspension assembly comprising a moving element that couples to a stylus, and a plurality of compliant elements configured to suspend the moving element from the compliant element mounting frame;
 a displacement sensing assembly arranged to sense displacement of the moving element relative to at least one of the compliant element mounting frame and the rigid probe body structure, the displacement sensing configuration comprising a displacement sensor that outputs a respective displacement signal; and
 a circuit board assembly comprising a first, second, and third component mounting portions that extend along the direction of the probe body axis;
 wherein the plurality of compliant elements are attached to an attachment portion of the compliant element mounting frame that is distally located relative to a distal end of the circuit board assembly; and
 wherein the first, second, and third component mounting portions of the circuit board assembly are arranged around the axial extension portion of the rigid probe body structure and between the upper mounting portion and the attachment portion of the compliant element mounting frame.

17. The coordinate measuring probe body of claim 16, wherein the first, second, and third component mounting portions are electrically interconnected with a flexible connector component such that the first, second, and third component mounting portions and the flexible connector component form a foldable circuit board assembly.

18. The coordinate measuring probe body of claim 17, wherein a field programmable gate array is mounted on one of the first, second, and third component mounting portions, and further wherein an end portion of the flexible connector component extends beyond the first, second, and third component mounting portions and comprises connection elements that are configured to provide programmable access to the field programmable gate array.

19. The coordinate measuring probe body of claim 16, wherein the first, second, and third component mounting portions comprise multi-layer circuit boards that are electrically interconnected with a shared flexible layer comprising a flexible circuit member.

20. The coordinate measuring probe body of claim 16, wherein all of the compliant elements that suspend the moving element from the compliant element mounting frame, and the attachment portion of the compliant element mounting frame, are distally located relative to the distal end of the circuit board assembly.

* * * * *